United States Patent
Kominato et al.

(10) Patent No.: US 11,016,382 B2
(45) Date of Patent: May 25, 2021

(54) MASK BLANKS, PHASE SHIFT MASK, METHOD FOR MANUFACTURING PHASE SHIFT MASK, AND METHOD FOR MANUFACTURING SEMICONDUCTOR DEVICE

(71) Applicant: HOYA CORPORATION, Tokyo (JP)

(72) Inventors: Atsushi Kominato, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 56 days.

(21) Appl. No.: 16/704,832

(22) Filed: Dec. 5, 2019

(65) Prior Publication Data

US 2020/0117077 A1 Apr. 16, 2020

Related U.S. Application Data (63) Continuation of application No. 15/554,335, filed as application No. PCT/JP2016/051378 on Jan. 19, 2016, now Pat. No. 10,551,733.

(30) Foreign Application Priority Data

Mar. 24, 2015 (JP) .................................. 2015-060699

(51) Int. Cl.
| | | |
|---|---|---|
| *G03F 1/32* | (2012.01) | |
| *G03F 1/74* | (2012.01) | |
| *G03F 1/54* | (2012.01) | |
| *C23C 14/06* | (2006.01) | |
| *C23C 14/58* | (2006.01) | |
| *G03F 7/20* | (2006.01) | |
| *H01L 21/027* | (2006.01) | |

(52) U.S. Cl.
CPC ............... *G03F 1/32* (2013.01); *C23C 14/06* (2013.01); *C23C 14/0676* (2013.01); *C23C 14/5806* (2013.01); *G03F 1/54* (2013.01); *G03F 1/74* (2013.01); *G03F 7/2006* (2013.01); *H01L 21/0275* (2013.01)

(58) Field of Classification Search
CPC ..... G03F 1/32; G03F 1/54; G03F 1/74; G03F 7/2006
USPC .......................................................... 430/5
See application file for complete search history.

(56) References Cited

U.S. PATENT DOCUMENTS

| | | |
|---|---|---|
| 2003/0047691 A1 | 3/2003 | Musil et al. |
| 2004/0191646 A1 | 9/2004 | Yoshikawa et al. |
| 2005/0186487 A1 | 8/2005 | Inazuki et al. |
| 2006/0088774 A1 | 4/2006 | Yoshikawa et al. |
| 2007/0020534 A1* | 1/2007 | Yoshikawa ............... G03F 1/46 430/5 |
| 2009/0233182 A1 | 9/2009 | Yamada et al. |
| 2010/0092874 A1 | 4/2010 | Nozawa et al. |
| 2010/0167185 A1 | 7/2010 | Suzuki et al. |
| 2012/0034552 A1 | 2/2012 | Okubo et al. |
| 2012/0064438 A1 | 3/2012 | Yoshikawa et al. |
| 2012/0100466 A1* | 4/2012 | Hashimoto ............... G03F 1/58 430/5 |
| 2013/0130159 A1 | 5/2013 | Yoshikawa et al. |
| 2013/0130160 A1 | 5/2013 | Yoshikawa et al. |
| 2016/0195803 A1 | 7/2016 | Adachi et al. |
| 2017/0075210 A1 | 3/2017 | Shishido et al. |

FOREIGN PATENT DOCUMENTS

| | | |
|---|---|---|
| JP | 2004-301993 A | 10/2004 |
| JP | 2004-537758 A | 12/2004 |
| JP | 2005-241693 A | 9/2005 |
| JP | 2006-146151 A | 6/2006 |
| JP | 2007-078712 A | 3/2007 |
| JP | 2010-009038 A | 1/2010 |
| JP | 2010-156880 A | 7/2010 |
| JP | 2010-186069 A | 8/2010 |
| JP | 2010-217514 A | 9/2010 |
| JP | 5779290 B | 7/2015 |
| WO | 2007/037383 A1 | 4/2007 |
| WO | 2015/025922 A1 | 2/2015 |

OTHER PUBLICATIONS

U.S. Appl. No. 15/554,335, "Notice of Allowance", dated Sep. 19, 2019, 9 pages.
PCT/JP2016/051378, International Search Report dated Apr. 19, 2016.
PCT/JP2016/051378, Written Opinion dated Apr. 19, 2016.
JP2017-507534, Notification of Reason for Refusal dated Nov. 8, 2019.

* cited by examiner

*Primary Examiner* — John A McPherson
(74) *Attorney, Agent, or Firm* — Kilpatrick Townsend & Stockton LLP (57) ABSTRACT

A mask blank including a phase shift film is provided, wherein the phase shift film has a transmittance with respect to exposure light of an ArF excimer laser of not less than 10% and not more than 20% and is configured to transmit the exposure light to have a phase difference of not less than 150 degrees and not more than 190 degrees with respect to exposure light transmitted through the air for the same distance as a thickness of the phase shift film. A ratio of the metal content to the total content of the metal and silicon in the phase shift film is not less than 5% and not more than 10%, the oxygen content in the phase shift film is 10 atom % or more, and the silicon content in the phase shift film is three times or more the oxygen content.

19 Claims, 2 Drawing Sheets

MASK BLANKS, PHASE SHIFT MASK, METHOD FOR MANUFACTURING PHASE SHIFT MASK, AND METHOD FOR MANUFACTURING SEMICONDUCTOR DEVICE

CROSS REFERENCE TO RELATED APPLICATIONS

This application is a continuation of U.S. patent application Ser. No. 15/554,335, filed Aug. 29, 2017, the contents of which is incorporated herein by reference in its entirety and which is a National Stage application of International Application No. PCT/JP2016/051378 filed Jan. 19, 2016, the contents of which is incorporated herein by reference in its entirety and which claims priority to Japanese Patent Application No. 2015-060699, filed Mar. 24, 2015.

TECHNICAL FIELD

The present disclosure relates to a mask blank, a phase shift mask manufactured using the mask blank, and a method for manufacturing the phase shift mask. The present disclosure also relates to a method for manufacturing a semiconductor device using the phase shift mask.

BACKGROUND ART

In a manufacturing process of a semiconductor device, a fine pattern is generally formed using a photolithographic method. In the formation of the fine pattern, multiple transfer masks are usually used. Refinement of a pattern for the semiconductor device requires shortening of a wavelength of an exposure light source used in photolithography, in addition to the refinement of a mask pattern formed in the transfer mask. Nowadays, the exposure light sources used in the manufacture of semiconductor devices are shifting from KrF excimer lasers (wavelength: 248 nm) to ArF excimer lasers (wavelength: 193 nm), that is, shorter wavelength light sources are increasingly used.

The types of transfer masks include a conventional binary mask including a light shielding film pattern made of a chromium-based material on a transparent substrate, and a half tone phase shift mask. A molybdenum silicide (MoSi)-based material is widely used for a phase shift film of the half tone phase shift mask. However, as disclosed in Patent Document 1, it has been discovered recently that the MoSi-based film has a low resistance to exposure light of an ArF excimer laser (that is, so-called ArF light fastness is low). In Patent Document 1, the ArF light fastness is enhanced by subjecting the MoSi-based film after formation of a pattern to the plasma treatment, ultraviolet (UV) light irradiation treatment, or heat treatment to form a passivation film on a surface of the pattern of the MoSi-based film.

Patent Document 2 discloses a defect repairing technique in which a xenon difluoride ($XeF_2$) gas is supplied to a black defect portion of a light shielding film while irradiating the portion with electron beams to etch and remove the black defect portion (the defect repair by irradiation of charged particles such as electron beams as above is hereafter simply referred to as EB defect repair). While the EB defect repair was originally used to correct black defects in an absorber film of a reflective mask for extreme ultraviolet lithography (EUV lithography), it has recently been used for correcting black defects of a MoSi half tone mask as well.

Patent Document 3 discloses the mask structure of a half tone phase shift mask with a high transmittance. Since the conventional phase shift film with a high transmittance formed of a two-layer structure easily thickens, it has the problem that the pattern easily collapses when a fine optical proximity correction (OPC) pattern is formed. The phase shift film of Patent Document 3 is thinner than the phase shift film of a two-layer structure, and thus, the pattern does not easily collapse even if the fine OPC pattern is formed.

PRIOR ART DOCUMENTS

Patent Documents

Patent Document 1: Japanese Patent Application Publication 2010-217514
Patent Document 2: PCT Application Japanese Translation Publication 2004-537758
Patent Document 3: Japanese Patent Application Publication 2010-9038

SUMMARY OF THE DISCLOSURE

Problems to be Solved by the Disclosure

In a half tone phase shift mask used in photolithography by applying ArF excimer laser light as exposure light (hereinafter also referred to as ArF exposure light), it is necessary for a half tone phase shift film (hereinafter simply referred to as "phase shift film") to simultaneously have a function to transmit the ArF exposure light at a predetermined transmittance, and a function to generate a predetermined phase difference (phase shift amount) between the ArF exposure light transmitted through the phase shift film and the light transmitted through the air for the same distance as a thickness of the phase shift film. A phase shift film with a property of a transmittance of less than 10% to the ArF exposure light has been widely used, and the general phase shift amount has been around 180 degrees. A material for a phase shift film of a single layer structure (A single layer structure including a region where oxidation of its surface layer is inevitable. The single layer structure is hereinafter deemed as including an oxidized region on its surface layer, excluding when particularly referring to the oxidized region of the surface layer.) which simultaneously satisfies both conditions of the phase shift amount and the transmittance to the ArF exposure light as mentioned above and is capable of achieving a lesser film thickness is relatively limited. A material formed from molybdenum silicide nitride (MoSiN) satisfies these conditions, and has been used widely.

Nowadays, there is an increased need for a phase shift film with a high transmittance (phase shift film having a transmittance of 10% or more) in order to obtain a higher phase shift effect for the transmitted light passing nearby a pattern edge in a half tone phase shift mask. For a conventional phase shift film of a single layer structure made of MoSiN, in order to ensure a predetermined phase difference while achieving the transmittance of 10% or more, the molybdenum content in the phase shift film needs to be decreased, for example, a ratio [%] of the molybdenum content [atom %] divided by the total content [atom %] of molybdenum (Mo) and silicon (Si) in the phase shift film (hereinafter referred to as "Mo/[Mo+Si] ratio") needs to be 4% or less. However, the decrease in molybdenum content in the phase shift film gives rise to a problem of the decrease in film conductivity. The decrease in molybdenum content in the phase shift film also gives rise to a problem of the low etching rate in the above-described EB defect repair for a black defect in the phase shift film.

The material used for the phase shift film includes molybdenum silicide oxynitride (MoSiON). While the phase shift film of a single layer structure made of MoSiON is thicker than the phase shift film of a single layer structure made of MoSiN, it can have a transmittance of 10% or more while ensuring the predetermined phase difference even if the molybdenum content is relatively high (e.g., Mo/[Mo+Si] ratio of 5% or more). However, it was demonstrated that the mask blank including the phase shift film of a single layer structure made of MoSiON has the following problem.

When a black defect is found in a phase shift film during a mask inspection in the manufacture of a phase shift mask from a mask blank, it is often repaired by the EB defect repair. It was newly found that when the black defect in the phase shift film of a single layer structure made of MoSiON is repaired by the EB defect repair, the detection of an etching end point for detecting a boundary between the phase shift film and the transparent substrate becomes more difficult than in the phase shift film of a single layer structure made of MoSiN.

The present disclosure was made to solve the above existing problems. It is an aspect of the present disclosure to provide a mask blank which includes a phase shift film with a high transmittance on a transparent substrate, wherein even if the phase shift film has optical properties that it has a transmittance of 10% or more while ensuring a predetermined phase difference, it is relatively easy to detect the etching end point for detecting a boundary between the phase shift film and the transparent substrate during the EB defect repair, so that the highly accurate EB defect repair is possible. It is another aspect of the present disclosure to provide a high-transmittance phase shift mask with fewer black defects, which is manufactured using the mask blank. Further, it is still another aspect of the present disclosure to provide a method for manufacturing the phase shift mask. It is yet another aspect of the present disclosure to provide a method for manufacturing a semiconductor device using the phase shift mask.

Means for Solving Problems

In order to solve the above problems, the present disclosure includes the following configurations.
(Configuration 1)
A mask blank including a phase shift film on a transparent substrate,
wherein the phase shift film has a function to transmit exposure light of an ArF excimer laser at a transmittance of not less than 10% and not more than 20%, and a function to generate a phase difference of not less than 150 degrees and not more than 190 degrees between the exposure light transmitted through the phase shift film and the exposure light transmitted through the air for the same distance as a thickness of the phase shift film;
wherein the phase shift film is made of a material containing a metal, silicon, nitrogen, and oxygen;
wherein a ratio of the metal content to the total content of the metal and silicon in the phase shift film is not less than 5% and not more than 10%;
wherein the oxygen content in the phase shift film is 10 atom % or more; and
wherein the silicon content in the phase shift film is three times or more the oxygen content.
(Configuration 2)
The mask blank according to Configuration 1, wherein the oxygen content in the phase shift film is 20 atom % or less.
(Configuration 3)
The mask blank according to Configuration 1 or 2, wherein the nitrogen content in the phase shift film is 30 atom % or more.
(Configuration 4)
The mask blank according to any one of Configurations 1 to 3, wherein the nitrogen content in the phase shift film is 45 atom % or less.
(Configuration 5)
The mask blank according to any one of Configurations 1 to 4, wherein the phase shift film is formed in contact with a surface of the transparent substrate.
(Configuration 6)
The mask blank according to any one of Configurations 1 to 5, wherein the phase shift film has a thickness of 90 nm or less.
(Configuration 7)
The mask blank according to any one of Configurations 1 to 6, wherein the phase shift film has in its surface layer a layer having the oxygen content higher than the portion of the phase shift film excluding the surface layer.
(Configuration 8)
The mask blank according to any one of Configurations 1 to 7, including a light shielding film on the phase shift film.
(Configuration 9)
A phase shift mask, wherein a transfer pattern is formed in the phase shift film of the mask blank according to Configuration 8, and a light shielding band pattern is formed in the light shielding film.
(Configuration 10)
A method for manufacturing a phase shift mask using the mask blank according to Configuration 8, including the steps of:
forming a transfer pattern in the light shielding film by dry etching,
forming the transfer pattern in the phase shift film by dry etching with the light shielding film having the transfer pattern as a mask, and
forming the light shielding band pattern in the light shielding film by dry etching with a resist film having a light shielding band pattern as a mask.
(Configuration 11)
A method for manufacturing a semiconductor device, including the step of:
using the phase shift mask according to Configuration 9 to transfer the transfer pattern to a resist film on a semiconductor substrate by exposure.
(Configuration 12)
A method for manufacturing a semiconductor device, including the step of:
using the phase shift mask manufactured by the method for manufacturing a phase shift mask according to Configuration 10 to transfer the transfer pattern to a resist film on a semiconductor substrate by exposure.

Effect of the Disclosure

The mask blank of the present disclosure includes a phase shift film on a transparent substrate, and it is featured in that the phase shift film is made of a material containing a metal, silicon, nitrogen, and oxygen; a ratio of the metal content to the total content of metal and silicon in the phase shift film is not less than 5% and not more than 10%; the oxygen content in the phase shift film is 10 atom % or more; and the silicon content in the phase shift film is three times or more the oxygen content. By configuring the mask blank to have such a structure, the phase shift film can simultaneously ensure a function to transmit the exposure light from the ArF excimer laser at a transmittance of 10% or more, and a function to generate a phase difference of not less than 150 degrees and not more than 190 degrees between the exposure light transmitted through the phase shift film and the exposure light transmitted through the air for the same distance as the thickness of the phase shift film. In addition, the phase shift film facilitates the detection of an etching end point for detecting a boundary between the phase shift film and the transparent substrate when the EB defect repair is carried out, such that the insufficient defect repair and inadvertent digging of the transparent substrate can be avoided, thereby improving the accuracy of the EB defect repair.

DESCRIPTION OF THE EMBODIMENT

The embodiment of the present disclosure is described below.

[Mask Blank and Manufacture Thereof]

The inventors made a diligent study on a high-transmittance phase shift film of a single layer structure made of metal silicide oxynitride, such as MoSiON as the representative, and its composition, which enable a practically sufficient processing speed and easy detection of an etching end point for detecting a boundary between the phase shift film and the transparent substrate during the EB defect repair, thereby achieving the EB defect repair with high accuracy. The phase shift film as a subject matter of the embodiment of the present disclosure is a film that can ensure a predetermined phase difference (not less than 150 degrees and not more than 190 degrees) and a high transmittance (not less than 10% and not more than 20%) with respect to the exposure light (ArF excimer laser light). The optical properties of the phase shift film provide a high edge enhancement effect, and thus improve, in the transfer using the phase shift mask, resolution and focus tolerance. Also, the phase shift film configured to have a single layer structure improves a side wall shape upon forming a phase shift pattern by the dry etching as compared to the phase shift film of a laminated structure comprised of two or more layers. Further, since the phase shift film configured to have a single layer structure can reduce man-hours in the manufacturing process and the number of steps in the film formation as compared to the phase shift film of a laminated structure comprised of two or more layers, the defect generation can be restrained. Therefore, it is possible to reduce the number of sections which are to be subjected to the defect repair.

First, optically-required values of the phase shift film required in the present disclosure are described together with the reasons. Then, the material composition of the phase shift film is described, which can satisfy the optically-required values and enable the highly accurate EB defect repair (during which the end point can be detected with high accuracy).

The phase shift film should have a transmittance of 10% or more with respect to the ArF exposure light from the ArF excimer laser light source at a wavelength of 193 nm. This can provide light intensity distribution in which the vicinity of the pattern edge is further emphasized in comparison to the conventional half tone phase shift mask, which improves the transfer performance such as resolution and focus tolerance of the phase shift mask manufactured using this phase shift film.

However, if the transmittance of the phase shift film becomes too high, unintended light intensity distribution referred to as a sub-peak easily occurs, which is caused by an interference between the diffracted light from the transfer pattern and the light transmitted through a field portion comprised of portions of the phase shift film other than the phase shift pattern. The light intensity in the portion of the sub-peak is enhanced, which develops a defect to be transferred (this is referred to as "sub-peak transfer"). In view of suppression of the unintended sub-peak transfer, the phase shift film preferably has a transmittance of 20% or less with respect to the ArF exposure light. In order to increase the tolerance for various pattern layouts to ease restrictions on the pattern layouts, the phase shift film preferably has the transmittance of 15% or less with respect to the ArF exposure light.

Moreover, the phase shift film should be adjusted such that the phase difference between the ArF exposure light transmitted therethrough and the light transmitted through the air for the same distance as the thickness of the phase shift film is not less than 150 degrees and not more than 190 degrees in order to obtain a suitable phase shift effect. The upper limit of the phase difference in the phase shift film is more preferably 180 degrees or less. This is because it is possible to reduce the effect of increase in phase difference caused by the slight etching of the transparent substrate during the dry etching for forming a pattern in the phase shift film. This is also because the recent methods of irradiating the phase shift mask with the ArF exposure light from the exposure apparatus often apply incidence of the ArF exposure light from a direction tilted at a predetermined angle to the direction vertical to a film surface of the phase shift film.

In the EB defect repair of the phase shift film made of metal silicide oxynitride, three elements are practically important for highly accurate EB defect repair: the etching rate of metal silicide oxynitride, a difference in etching rate between metal silicide oxynitride and the substrate, and accuracy of detection of an etching end point. These characteristics need to be satisfied without compromising the requirements for providing the above described transmittance and phase difference required for the phase shift film.

A metallic element in the metal silicide oxynitride is preferably a transition metal element. While molybdenum (Mo) has been widely used as the transition metal element contained in the phase shift film, the transition metal element is not limited thereto. The transition metal element to be contained in the phase shift film includes any one or more metallic elements of tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), and palladium (Pd). Further, the metallic elements other than transition metal elements include aluminum (Al), indium (In), tin (Sn), gallium (Ga), and the like.

In the EB defect repair, when a black defect is irradiated with electron beams, at least any one of Auger electrons, secondary electrons, characteristic X-rays, and backscattered electrons emitted from the irradiated portion is detected, thereby detecting an etching end point. For example, in the case of detecting Auger electrons emitted from the portion irradiated with electron beams, the change of material composition is mainly observed by Auger electron spectroscopy (AES). In the case of detecting secondary electrons, the change of surface shape in a SEM image is mainly observed. In the case of detecting characteristic X-rays, the change of material composition is mainly observed by energy dispersive X-ray spectrometry (EDX) or wavelength-dispersive X-ray spectrometry (WDX). In the case of detecting backscattered electrons, the change of material composition and crystal state is mainly observed by electron beam backscatter diffraction (EBSD).

In the EB defect repair of the phase shift film made of the metal silicide oxynitride, a fluorine-based gas in an unexcited state ($XeF_2$, $XeF_4$, $XeF_6$, $XeOF_2$, $XeOF_4$, $XeO_2F_2$, $XeO_3F_2$, $XeO_2F_4$, $ClF_3$, $ClF$, $BrF_5$, $BrF$, $IF_3$, $IF_5$, and the like are applicable, and $XeF_2$ is particularly preferable) is supplied to a black defect portion in the phase shift film while irradiating the portion with electron beams, thereby etching and removing the black defect portion. The etching rate at this point depends on the ratio [%] of the content [atom %] of metal (M) divided by the total content [atom %] of metal and silicon (Si) (hereinafter referred to as "M/[M+Si] ratio"). As a result of close examination of the etching rate in relation to this ratio, it was found that the practically sufficient etching rate is ensured when the M/[M+Si] ratio of the phase shift film made of the metal silicide oxynitride is 5% or more. It was additionally found that the etching selectivity in relation to the transparent substrate mainly including silicon oxide can also be sufficiently ensured.

Within the range of the M/[M+Si] ratio up to about 34%, absorption of the exposure light (ArF exposure light) tends to increase as the M/[M+Si] ratio in the phase shift film increases. When the M/[M+Si] ratio becomes too high, the oxygen or nitrogen content should be significantly increased in order to realize the phase shift film transmittance of from 10% to 20% with respect to the exposure light. However, a refractive index tends to lower as the oxygen content in the phase shift film increases, and thus, it becomes difficult to avoid the significant increase in film thickness for ensuring the predetermined phase difference. When the phase shift film thickens, it gives rise to the problem that a fine mask pattern on a mask collapses, or the bias (EMF bias) due to an electromagnetic field effect becomes large in a mask pattern. It was found that the upper limit of the M/[M+Si] ratio should be preferably 10% in order to control the pattern collapse or keep the EMF bias within an acceptable range. It was also found that when the M/[M+Si] ratio is 10% or less, the resistance of the phase shift film to an accumulated exposure amount of the ArF exposure light is practically sufficient.

In order to keep the M/[M+Si] ratio of 5% or more in the phase shift film while providing the optical property that the transmittance to the exposure light is 10% or more, the oxygen content should be equal to or greater than a predetermined amount. As a result of evaluation of the amount, it was found that the oxygen content in the phase shift film should be 10 atom % or more. Additionally, in order to further enhance the transmittance of the phase shift film with respect to the exposure light, the oxygen content is preferably 12 atom % or more. However, in order to easily detect an etching end point in the EB defect repair, the oxygen content in the phase shift film should be 20 atom % or less, preferably 18 atom % or less, further preferably 15 atom % or less.

As described above, the phase shift film made of metal silicide oxynitride contains certain amounts or more of silicon and oxygen. The transparent substrate made of, for example, synthetic quartz mainly contains silicon and oxygen, and constituent elements of the phase shift film and the transparent substrate are relatively similar to each other. Therefore, there is a problem that the detection of the etching end point is difficult no matter which detection method as described above is used in the EB defect repair. However, by configuring the silicon content percentage in the phase shift film to be three times or more the oxygen content percentage in this embodiment, the obvious difference in detection signal before and after the etching end point is caused, which enables the detection of the etching end point.

In order to make the phase shift film as thin as possible while controlling the transmittance and phase difference with respect to the exposure light to be respective desired values, it is effective to contain nitrogen (N) so that the extinction coefficient k and refractive index n of the phase shift film with respect to the exposure light are greater than the case when only the oxygen (O) is contained. By containing nitrogen within the range of not less than 30 atom % and not more than 45 atom % in the phase shift film, the phase shift film can have the thickness of 90 nm or less as described below and the above mentioned desired transmittance and phase difference, which is effective in forming a fine pattern on a photomask and reducing the bias (EMF bias) due to the electromagnetic field effect.

The material of the phase shift film may contain, in addition to the metal, silicon, nitrogen, and oxygen, 10 atom % or less of elements other than these main constituent elements. As long as the total content of the elements other than the main constituent elements in the phase shift film is 10 atom % or less, an effect on various optical properties and various properties related to the EB defect repair for the phase shift film is small, which is acceptable.

The overall structure of the mask blank is described below with reference to FIG. 1.

Figure 1:
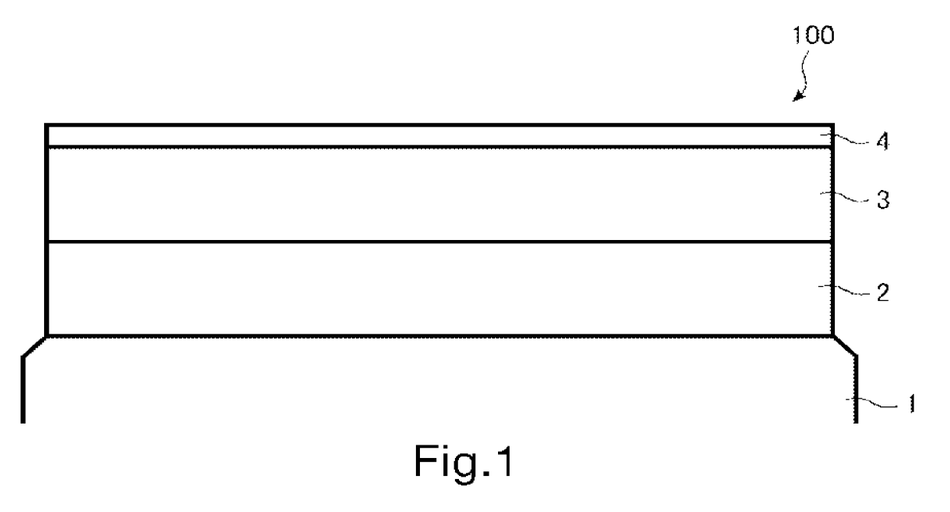
FIG. 1 is a cross-sectional view showing a structure of a mask blank according to an embodiment of the present disclosure.

FIG. 1 is a cross-sectional view showing a structure of a mask blank 100 according to an embodiment of the present disclosure. The mask blank 100 of the present disclosure shown in FIG. 1 has a structure in which a phase shift film 2, a light shielding film 3, and a hard mask film 4 are laminated in this order on a transparent substrate 1.

The transparent substrate 1 can be formed from quartz glass, aluminosilicate glass, soda-lime glass, low thermal expansion glass ($SiO_2$—$TiO_2$ glass, etc.), and the like, in addition to synthetic quartz glass. Among the above, synthetic quartz glass is particularly preferable as a material for forming the transparent substrate of the mask blank since it has a high transmittance to the ArF exposure light and also has sufficient stiffness not to be easily deformed.

The phase shift film 2 is preferably formed in contact with a surface of the transparent substrate 1. This is because a film made of a material causing difficulty in EB defect repair (e.g., a film made of a chromium-based material) preferably does not exist between the transparent substrate 1 and the phase shift film 2 during the EB defect repair.

The material of the phase shift film 2 is metal silicide oxynitride having the above described composition ratio.

The thickness of the phase shift film 2 is preferably at least 90 nm or less because film thinning can reduce the EMF bias. Thus, the thickness of the phase shift film 2 is further preferably 85 nm or less, and more preferably 80 nm or less. Further, the thinning of the phase shift film can suppress a failure due to the pattern collapse on the mask, and improve the yield of the phase shift mask.

In order to satisfy various conditions for the above optical properties and thickness of the phase shift film 2, the refractive index n of the phase shift film with respect to the exposure light (ArF exposure light) is preferably 1.9 or more, and more preferably 2.0 or more. Further, the refractive index n of the phase shift film is preferably 3.1 or less, and more preferably 2.7 or less. The extinction coefficient k of the phase shift film 2 with respect to the ArF exposure light is preferably 0.26 or more, and more preferably 0.29 or more. Further, the extinction coefficient k of the phase shift film 2 is preferably 0.62 or less, and more preferably 0.54 or less.

The refractive index n and extinction coefficient k of a thin film including the phase shift film 2 are not determined only by the composition of the thin film. Factors such as film density and crystal condition of the thin film also affect the refractive index n and extinction coefficient k. Therefore, the conditions in forming the thin film by the reactive sputtering are adjusted, so that the thin film is formed to have a desired refractive index n and extinction coefficient k. The effective conditions for configuring the phase shift film 2 to have the refractive index n and extinction coefficient k within the above-described ranges include, but are not limited to, the adjustment of a ratio of a noble gas and a reactive gas (such as oxygen gas or nitrogen gas) in a mixed gas in forming the phase shift film 2 by the reactive sputtering. Rather, there are a wide variety of conditions such as a pressure in a film forming chamber, power applied to the sputter target, and a positional relationship between the target and the transparent substrate 1 such as a distance in forming the phase shift film 2 by the reactive sputtering. These film forming conditions are specific to a film forming apparatus, and are adjusted arbitrarily so that the phase shift film 2 to be formed has the desired refractive index n and extinction coefficient k.

While the phase shift film 2 is formed by the sputtering, any sputtering, such as DC sputtering, RF sputtering, and ion beam sputtering, may be applied. In the case where the target used has low conductivity, application of RF sputtering or ion beam sputtering is preferable. However, in view of film forming rate, application of RF sputtering is more preferable.

The phase shift film 2 preferably has in its surface layer a layer having the oxygen content higher than the portion of the phase shift film 2 excluding the surface layer (which is hereafter simply referred to as a surface oxidized layer). The phase shift film 2 which includes in its surface layer the layer having the high oxygen content has a high resistance to cleaning liquid used in a cleaning step in the mask manufacturing process or the mask cleaning for repeatedly using the phase shift mask. Various oxidization treatments are applicable as a method of forming the surface oxidized layer of the phase shift film 2. The oxidization treatments include, for example, a heat treatment in a gas containing oxygen such as the atmosphere, a light irradiation treatment using a flash lamp, etc. in a gas containing oxygen, a treatment to bring ozone and oxygen plasma into contact with the uppermost layer, etc. It is particularly preferable to form the surface oxidized layer in the phase shift film 2 through the heat treatment or light irradiation treatment using a flash lamp, etc. where an effect to reduce film stress of the phase shift film 2 can be obtained simultaneously. The thickness of the surface oxidized layer of the phase shift film 2 is preferably 1 nm or more, and more preferably 1.5 nm or more. Further, the thickness of the surface oxidized layer of the phase shift film 2 is preferably 5 nm or less, and more preferably 3 nm or less.

The mask blank 100 has a light shielding film 3 on the phase shift film 2. Generally, in a binary transfer mask, an outer peripheral region outside the region where a transfer pattern is formed (transfer pattern forming region) is required to ensure optical density (OD) of not less than a predetermined value such that, upon the exposure transfer to a resist film on a semiconductor wafer using an exposure apparatus, the resist film will not be affected by the exposure light transmitted through the outer peripheral region. In this regard, the same holds for a phase shift mask. Usually, the outer peripheral region of a transfer mask including a phase shift mask desirably has OD of 3.0 or more, and at least 2.8 or more is necessary. The phase shift film 2 has a function to transmit the exposure light at a predetermined transmittance, and it is difficult to ensure the optical density of a predetermined value required in the outer peripheral region with the phase shift film 2 alone. Therefore, the light shielding film 3 for ensuring the lacking optical density should be laminated on the phase shift film 2 at the stage of manufacturing the mask blank 100. With such a structure of the mask blank 100, a phase shift mask 200 (see FIGS. 2A-2G) ensuring optical density of the predetermined value in the outer peripheral region can be manufactured by removing the light shielding film 3 in the region where the phase shift effect is used (basically, the transfer pattern forming region) during manufacture of the phase shift mask 200.

When the intensity of light incident on a target film is $I_0$, and the intensity of light transmitted through the target film is I, the optical density OD is defined by:

$$OD = -\log_{10}(I/I_0).$$

Any of a single layer structure and a laminated structure comprised of two or more layers is applicable to the light shielding film 3. Further, the light shielding film of the single layer structure as well as each layer in the light shielding film of a laminated structure comprised of two or more layers can be configured to have approximately the same composition in a thickness direction of the film or the layer, or to have a composition gradient in the thickness direction of the layer.

The mask blank 100 shown in FIG. 1 has a configuration in which the light shielding film 3 is laminated on the phase shift film 2 without any film therebetween. For the light shielding film 3 in the case of this configuration, it is necessary to use the material which has sufficient etching selectivity to the etching gas used in forming a pattern in the phase shift film 2.

The light shielding film 3 in this case is preferably made of a material containing chromium. The materials containing chromium for forming the light shielding film 3 can include a material containing chromium (Cr) and one or more elements selected from oxygen (O), nitrogen (N), carbon (C), boron (B), and fluorine (F), in addition to chromium metal. While a chromium-based material is generally etched with a mixed gas of a chlorine-based gas and an oxygen gas, the etching rate of the chromium metal with respect to the etching gas is not so high. Considering the enhancement of etching rate in relation to the etching gas that is the mixed gas of the chlorine-based gas and oxygen gas, the material for forming the light shielding film 3 preferably contains chromium and one or more elements selected from oxygen, nitrogen, carbon, boron, and fluorine. Further, the material containing chromium for forming the light shielding film can contain one or more elements of molybdenum (Mo), indium (In), and tin (Sn). Containing one or more elements of molybdenum, indium, and tin can increase the etching rate in relation to the mixed gas of the chlorine-based gas and oxygen gas.

The mask blank of the present disclosure is not limited to the one shown in FIG. 1. It can also be configured such that another film (etching stopper film) is provided between the phase shift film 2 and the light shielding film 3. In this case, a preferable structure is that the etching stopper film is made of the material containing chromium described above, and the light shielding film 3 is made of a material containing silicon.

The material containing silicon for forming the light shielding film 3 can contain a transition metal, and can also contain metallic elements other than the transition metal. The reason is that the pattern formed in the light shielding film 3 is basically a light shielding band pattern in the outer peripheral region, which has an accumulated radiation value of the ArF exposure light lower than in the transfer pattern region, and that a fine pattern is rarely provided in this outer peripheral region, such that substantial problems hardly occur even if the ArF light fastness is low. Another reason is that containing a transition metal in the light shielding film 3 significantly enhances the light shielding performance compared to the light shielding film 3 not containing a transition metal, so that the thickness of the light shielding film 3 can be reduced. The transition metals to be contained in the light shielding film 3 include any one metal such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), or an alloy thereof.

In this embodiment, the hard mask film 4 laminated on the light shielding film 3 is made of a material which has the etching selectivity with respect to the etching gas used for etching the light shielding film 3. Accordingly, the thickness of the resist film can be significantly reduced compared to the resist film directly used as a mask for the light shielding film 3.

Since the light shielding film 3 needs to ensure the predetermined optical density to have a sufficient light shielding function, there is a limit on the reduction of its thickness. The thickness of the hard mask film 4 is sufficient as long as the hard mask film 4 can function as an etching mask until the completion of dry etching for forming a pattern in the light shielding film 3 immediately thereunder, and basically the hard mask film 4 is not optically limited. Therefore, the thickness of the hard mask film 4 can be reduced significantly compared to the thickness of the light shielding film 3. Since the thickness of the resist film made of an organic material is sufficient as long as the resist film can function as an etching mask until the completion of dry etching for forming a pattern in the hard mask film 4, the thickness of the resist film can be reduced significantly compared to the resist film directly used as a mask for the light shielding film 3. Since the resist film can be thinned in this manner, the resist resolution can be improved while preventing the collapse of the formed pattern. In this way, while the hard mask film 4 laminated on the light shielding film 3 is preferably made of the above described material, the present disclosure is not limited to this embodiment. Also, a resist pattern can be formed directly on the light shielding film 3 in the mask blank 100 without forming the hard mask film 4, and then used as a mask to directly etch the light shielding film 3.

If the light shielding film 3 is made of the material containing chromium, the hard mask film 4 is preferably made of the material containing silicon given above. Since the hard mask film 4 in this case tends to have low adhesiveness to the resist film made of an organic material, it is preferable to treat the surface of the hard mask film 4 with hexamethyldisilazane (HMDS) to enhance the surface adhesiveness. The hard mask film 4 in this case is more preferably made of $SiO_2$, SiN, SiON, etc.

Further, if the light shielding film 3 is made of the material containing chromium, a material containing tantalum is also applicable as the material for the hard mask film 4, in addition to the above. The material containing tantalum in this case includes, in addition to tantalum metal, a material containing tantalum and one or more elements selected from nitrogen, oxygen, boron, and carbon, for example, Ta, TaN, TaO, TaON, TaBN, TaBO, TaBON, TaCN, TaCO, TaCON, TaBCN, and TaBOCN.

Further, if the light shielding film 3 is made of the material containing silicon, the hard mask film 4 is preferably made of the material containing chromium given above.

In the mask blank 100, a resist film made of an organic material and having a thickness of 100 nm or less is preferably formed in contact with the surface of the hard mask film 4. In the case of a fine pattern to meet DRAM hp32 nm generation, a sub-resolution assist feature (SRAF) with 40 nm line width may be provided on a transfer pattern (phase shift pattern) to be formed in the hard mask film 4. Even in such a case, a cross-sectional aspect ratio of the resist pattern is as low as 1:2.5, and thus, the collapse and falling off of the resist pattern can be prevented in rinsing and developing the resist film. The thickness of the resist film is more preferably 80 nm or less because the collapse and falling off of the resist pattern can be further prevented.

[Phase Shift Mask and Manufacture Thereof]

The phase shift mask 200 of this embodiment is featured in that a transfer pattern (phase shift pattern) is formed in the phase shift film 2 of the mask blank 100, and a light shielding band pattern is formed in the light shielding film 3. In the case of the configuration in which the mask blank 100 includes the hard mask film 4, the hard mask film 4 is removed during manufacture of the phase shift mask 200.

The method for manufacturing a phase shift mask according to the present disclosure uses the mask blank 100 described above is featured by including the steps of: performing the dry etching, thereby forming a transfer pattern in the light shielding film 3; performing the dry etching using as a mask the light shielding film 3 having the transfer pattern, thereby forming the transfer pattern in the phase shift film 2; and performing the dry etching using as a mask a resist film (second resist pattern 6*b*) having a light shielding band pattern, thereby forming the light shielding band pattern in the light shielding film 3. The method for manufacturing the phase shift mask 200 of the present disclosure is described below in accordance with the manufacturing process shown in FIGS. 2A to 2G. The method explained here is the method for manufacturing the phase shift mask 200 using the mask blank 100 having the hard mask film 4 laminated on the light shielding film 3, wherein a material containing chromium is used for the light shielding film 3, and a material containing silicon is used for the hard mask film 4.

First, a resist film is formed in contact with the hard mask film 4 of the mask blank 100 by a spin coating method. Next, a first pattern, which is a transfer pattern (phase shift pattern) to be formed in the phase shift film, is drawn on the resist film with electron beams by exposure, and a predetermined treatment such as development is conducted, thereby forming a first resist pattern 5*a* having the phase shift pattern (see FIG. 2A). Subsequently, the dry etching with a fluorine-based gas using the first resist pattern 5*a* as a mask is performed, so that the first pattern (hard mask pattern 4*a*) is formed in the hard mask film 4 (see FIG. 2B).

Figure 2A:
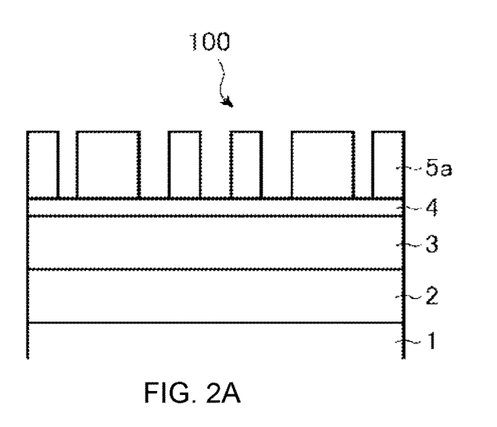
FIGS. 2A to 2G are schematic cross-sectional views showing a manufacturing process of a phase shift mask according to the embodiment of the present disclosure.
Figures 2B, 2C:
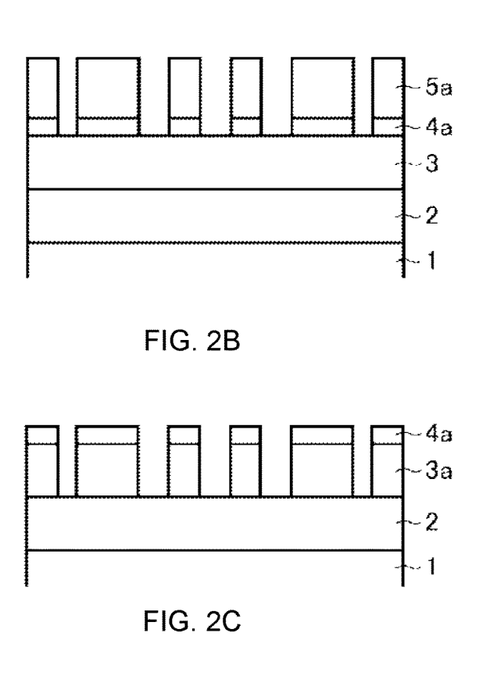

Next, after removing the first resist pattern 5*a*, the dry etching with a mixed gas of a chlorine-based gas and an oxygen gas using the hard mask pattern 4*a* as a mask is performed, so that the first pattern (light shielding pattern 3a) is formed in the light shielding film 3 (see FIG. 2C). Subsequently, the dry etching with the fluorine-based gas using the light shielding pattern 3a as a mask is performed, so that the first pattern (phase shift pattern 2a) is formed in the phase shift film 2, and at the same time the hard mask pattern 4a is removed (see FIG. 2D).

Next, a resist film is formed on the mask blank 100 by the spin coating method. Then, a second pattern, which is a pattern (light shielding pattern) to be formed in the light shielding film 3, is drawn on the resist film with electron beams by exposure, and a predetermined treatment such as development is conducted, thereby forming a second resist pattern 6b having the light shielding pattern (see FIG. 2E). Since the second pattern is relatively large, the exposure drawing using the laser beam from a laser writer with high throughput may be applied instead of the exposure drawing using the electron beams.

Subsequently, the dry etching with the mixed gas of the chlorine-based gas and oxygen gas using the second resist pattern 6b as a mask is performed, so that the second pattern (light shielding pattern 3b) is formed in the light shielding film 3 (see FIG. 2F). Further, the second resist pattern 6b is removed, and a predetermined treatment such as cleaning is conducted, so that the phase shift mask 200 is obtained (see FIG. 2G).

There is no particular limitation on the chlorine-based gas used in the dry etching described above, as long as chlorine (Cl) is contained. Such a chlorine-based gas includes, for example, $Cl_2$, $SiCl_2$, $CHCl_3$, $CH_2Cl_2$, and $BCl_3$. Also, there is no particular limitation on the fluorine-based gas used in the dry etching described above, as long as fluorine (F) is contained. Such a fluorine-based gas includes, for example, $CHF_3$, $CF_4$, $C_2F_6$, $C_4F_8$, and $SF_6$. Particularly, the fluorine-based gas free of C can further reduce the damage on a glass substrate since it has a relatively low etching rate in the glass substrate.

The phase shift mask 200 of the present disclosure is manufactured using the mask blank 100 mentioned above. Therefore, in the phase shift film having the transfer pattern formed therein (phase shift pattern), a transmittance with respect to the ArF exposure light is not less than 10% and not more than 20%, and a phase difference between the exposure light transmitted through the phase shift pattern and the exposure light transmitted through the air for the same distance as the thickness of the phase shift pattern is within the range of not less than 150 degrees and not more than 190 degrees, so that the high phase shift effect can be generated. Additionally, upon the EB defect repair applied to a black defect found in the mask inspection during manufacture of the phase shift mask 200, the etching end point can be relatively easily detected.

[Manufacture of Semiconductor Device]

The method for manufacturing a semiconductor device of the present disclosure is featured in that the above described phase shift mask 200, or the phase shift mask 200 manufactured using the above described mask blank 100 is used to transfer the transfer pattern to the resist film on the semiconductor substrate by exposure. Since the phase shift mask 200 of the present disclosure generates the high phase shift effect, when the phase shift mask 200 of the present disclosure is used for the exposure transfer to the resist film on the semiconductor device, the pattern can be formed in the resist film on the semiconductor device with the accuracy that sufficiently satisfies the design specification. Further, even if the phase shift mask in which the black defect portion has been corrected by the EB defect repair during its manufacture is used for the exposure transfer to the resist film on the semiconductor device, it is possible to prevent the transfer failure from being caused in the resist film on the semiconductor device corresponding to the pattern portion of the phase shift mask where the black defect has been present. Therefore, if a circuit pattern is formed by dry-etching a processed film using this resist pattern as a mask, a highly accurate circuit pattern with high yield can be formed without disconnection and short-circuit of wires caused by poor accuracy or transfer failure.

EXAMPLES

The embodiment of the present disclosure is described more specifically below based on examples.

Example 1

[Manufacture of Mask Blank]

The transparent substrate 1 was prepared, which had a main surface dimension of about 152 mm×about 152 mm and a thickness of about 6.35 mm, and was made of synthetic quartz glass. The transparent substrate 1 had been polished to have surface roughness not exceeding a predetermined value (root mean square roughness Rq of 0.2 nm or less) in its end faces and main surfaces, and then subjected to predetermined cleaning and drying processes.

Next, the transparent substrate 1 was placed in a single-wafer DC sputtering apparatus, a mixed target of molybdenum (Mo) and silicon (Si) (Mo:Si=8 atom %: 92 atom %) was used, and the reactive sputtering (DC sputtering) using a mixed gas of argon (Ar), nitrogen ($N_2$), oxygen ($O_2$), and helium (He) as a sputtering gas was conducted, such that the phase shift film 2 made of molybdenum, silicon, nitrogen, and oxygen (MoSiON film) and having a thickness of 74 nm was formed on the transparent substrate 1. Through the above procedure, the single-layer phase shift film 2 having the thickness of 74 nm was formed in contact with a surface of the transparent substrate 1.

Then, the transparent substrate 1 with the phase shift film 2 formed thereon was subjected to a heat treatment in order to reduce film stress of the phase shift film 2 and form an oxidized layer on a surface layer. In particular, a heating furnace (electric furnace) was used to conduct the heat treatment at a heating temperature of 450° C. in the air for one hour. Another transparent substrate 1, which had had the phase shift film 2 formed on its main surface under the same conditions and been subjected to the heat treatment, was prepared. The transmittance and phase difference of the phase shift film 2 with respect to the light at a wavelength of 193 nm were measured using a phase shift amount measurement apparatus (MPM193 manufactured by Lasertec Corporation). As a result, the transmittance was 12.3%, and the phase difference was 176.5 degrees (deg). Further, after analyzing the phase shift film 2 by a scanning transmission electron microscope (STEM) and EDX, formation of the oxidized layer having a thickness of about 1.5 nm measured from the surface of the phase shift film 2 was confirmed. Additionally, a spectroscopic ellipsometer (M-2000D manufactured by J. A. Woollam) was used to measure the optical properties of this phase shift film 2. As a result, at a wavelength of 193 nm, the refractive index n was 2.33, and the extinction coefficient k was 0.42 (the refractive index n and extinction coefficient k for each thin film described below was measured using the same spectroscopic ellipsometer).

Still another transparent substrate 1, which had had the phase shift film 2 formed thereon by the procedure similar to the above, was prepared, the film composition in the phase shift film 2 was measured by X-ray photoelectron spectroscopy (XPS), and the measured results were revised (calibrated) to correspond to the Rutherford backscattering spectrometry (RBS) measured results. As a result, the composition in the phase shift film 2 other than the oxidized layer in its surface layer was 2.8 atom % for Mo, 43.4 atom % for Si, 14.0 atom % for O, and 39.8 atom % for N. Therefore, Mo/(Mo+Si) is 6.1%, and Si/O is 3.1 in the phase shift film 2. Further, any composition gradient in the film thickness direction was not particularly found in the phase shift film 2 other than the oxidized layer in its surface layer.

Then, the transparent substrate 1 with the phase shift film 2 formed thereon was placed in the single-wafer DC sputtering apparatus, a chromium (Cr) target was used, and the reactive sputtering (DC sputtering) using a mixed gas of argon (Ar), carbon dioxide ($CO_2$), nitrogen ($N_2$), and helium (He) as a sputtering gas was conducted, such that the lowermost layer of the light shielding film 3 made of CrOCN and having a thickness of 16 nm was formed on the phase shift film 2. The lowermost layer had the refractive index n of 2.29 and extinction coefficient k of 1.00 with respect to the light at a wavelength of 193 nm. Next, the same chromium (Cr) target was used, and the reactive sputtering (DC sputtering) using the mixed gas of argon (Ar), carbon dioxide ($CO_2$), nitrogen ($N_2$), and helium (He) as a sputtering gas was conducted, such that a lower layer of the light shielding film 3 made of CrOCN and having a thickness of 41 nm was formed on the lowermost layer of the light shielding film 3. The lower layer had the refractive index n of 1.80 and extinction coefficient k of 1.22 with respect to the light at a wavelength of 193 nm.

Next, the same chromium (Cr) target was used, and the reactive sputtering (DC sputtering) using a mixed gas of argon (Ar) and nitrogen ($N_2$) as a sputtering gas was conducted, such that an upper layer of the light shielding film 3 made of CrN and having a thickness of 6 nm was formed on the lower layer of the light shielding film 3. The upper layer had the refractive index n of 1.51 and extinction coefficient k of 1.60 with respect to the light at a wavelength of 193 nm. By the above method, the light shielding film 3 made of the chromium-based material and having the total thickness of 63 nm was formed, which had the three-layer structure comprised of, from the phase shift film 2 side, the lowermost layer made of CrOCN, the lower layer made of CrOCN, and the upper layer made of CrN. The optical density (OD) of the laminated structure of the phase shift film 2 and the light shielding film 3 at a wavelength of 193 nm as measured was 3.0 or more.

Further, the transparent substrate 1 with the phase shift film 2 and the light shielding film 3 laminated thereon was placed in a single-wafer RF sputtering apparatus, a silicon dioxide ($SiO_2$) target was used, and the RF sputtering using the argon (Ar) gas as a sputtering gas was conducted, such that the hard mask film 4 made of silicon and oxygen and having a thickness of 5 nm was formed on the light shielding film 3. By the above method, the mask blank 100 was manufactured, which included the single-layer phase shift film 2, the light shielding film 3 of a three-layer structure, and the hard mask film 4 laminated on the transparent substrate 1.

[Manufacture of Phase Shift Mask]

Then, the mask blank 100 of Example 1 was used to manufacture the phase shift mask 200 of Example 1 through the following procedure. First, the HMDS treatment was applied to a surface of the hard mask film 4. Subsequently, the resist film made of a chemically amplified resist for electron beam drawing and having a thickness of 80 nm was formed in contact with the surface of the hard mask film 4 by the spin coating method. Then, a first pattern, which was a phase shift pattern to be formed in the phase shift film 2, was drawn on the resist film with electron beams, and the predetermined development process was conducted, thereby forming a first resist pattern 5a having the first pattern (see FIG. 2A). In the first pattern drawn with electron beams at this point, a programmed defect was added in addition to the phase shift pattern to be originally formed, so that a black defect was formed in the phase shift film 2.

Next, the dry etching with a $CF_4$ gas using the first resist pattern 5a as a mask was conducted, so that the first pattern (hard mask pattern 4a) was formed in the hard mask film 4 (see FIG. 2B).

Next, the first resist pattern 5a was removed by ashing or by a peeling liquid and the like. Subsequently, the dry etching with a mixed gas of chlorine and oxygen (gas flow ratio of $Cl_2:O_2$=4:1) using the hard mask pattern 4a as a mask was conducted, so that the first pattern (light shielding pattern 3a) was formed in the light shielding film 3 (see FIG. 2C).

Figure 2D:
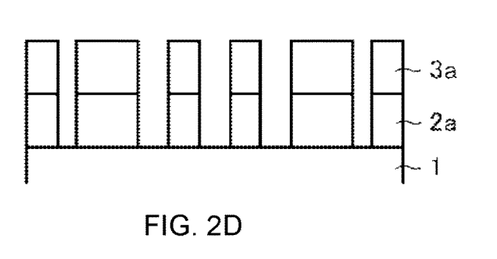
Figure 2E:
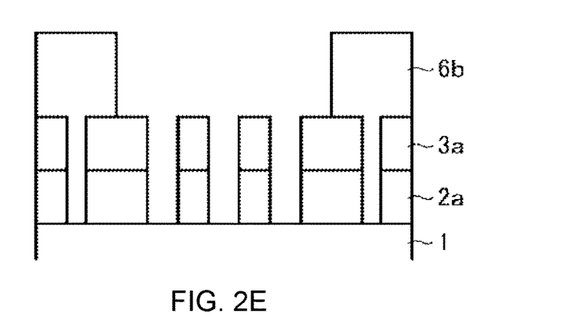
Figure 2F:
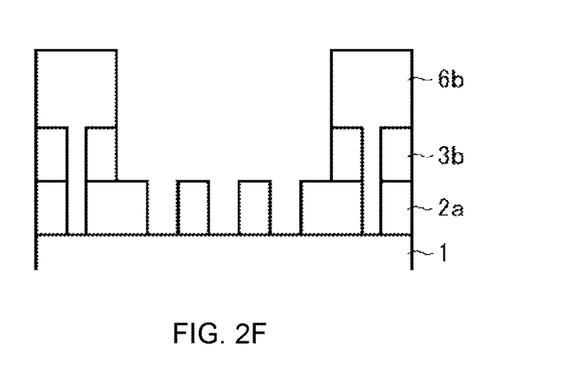
Figure 2G:
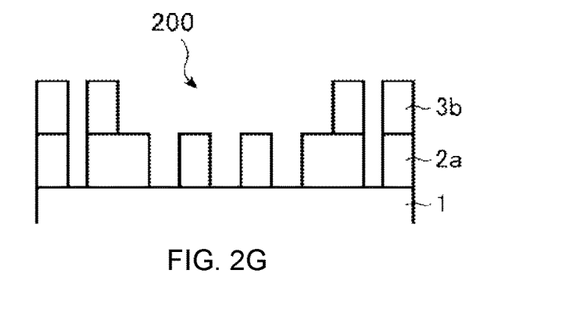

Then, the dry etching with the fluorine-based gas ($SF_6$+ He) using the light shielding pattern 3a as a mask was conducted, so that the first pattern (phase shift pattern 2a) was formed in the phase shift film 2, and at the same time the hard mask pattern 4a was removed (see FIG. 2D).

Next, the resist film made of the chemically amplified resist for electron beam drawing and having a thickness of 150 nm was formed on the light shielding pattern 3a by the spin coating method. Then, a second pattern, which was a pattern (light shielding pattern) to be formed in the light shielding film 3, was drawn on the resist film by exposure, and a predetermined treatment such as development was conducted, so that a second resist pattern 6b having the light shielding pattern was formed (see FIG. 2E). Subsequently, the dry etching with the mixed gas of chlorine and oxygen (gas flow ratio of $Cl_2:O_2$=4:1) using the second resist pattern 6b as a mask was conducted, so that the second pattern (light shielding pattern 3b) was formed in the light shielding film 3 (see FIG. 2F). Further, the second resist pattern 6b was removed, and a predetermined treatment such as cleaning was carried out, so that the phase shift mask 200 was obtained (see FIG. 2G).

The half tone phase shift mask 200 of Example 1 manufactured was subjected to mask pattern inspection by a mask inspection apparatus, and a black defect was confirmed in the phase shift pattern 2a at a location where the programmed defect had been arranged. After the black defect portion was subjected to the EB defect repair using the electron beams and $XeF_2$ gas, the etching end point managed to be detected easily, and the etching on the surface of the transparent substrate 1 managed to be minimized.

Using AIMS193 (manufactured by Carl Zeiss), a simulation of a transfer image upon the exposure transfer to the resist film on the semiconductor device with the exposure light at a wavelength of 193 nm was performed on the half tone phase shift mask 200 of Example 1 after the EB defect repair. As a result of inspection of the image by the exposure transfer in this simulation, it was found that the design specification was satisfied sufficiently. Further, the transfer image of the portion subjected to the EB defect repair was comparable to the transfer images of the other regions. It can be considered from this result that the circuit pattern finally formed on the semiconductor device may have great accuracy, even if the phase shift mask of Example 1 after the EB defect repair is set on a mask stage of an exposure apparatus to perform the exposure transfer to the resist film on the semiconductor device.

Example 2

[Manufacture of Mask Blank]

The transparent substrate 1 was prepared by a procedure similar to Example 1. Next, the transparent substrate 1 was placed in the single-wafer DC sputtering apparatus, a mixed target of molybdenum (Mo) and silicon (Si) (Mo:Si=8 atom %: 92 atom %) was used, and the reactive sputtering (DC sputtering) using the mixed gas of argon (Ar), nitrogen ($N_2$), oxygen ($O_2$), and helium (He) as a sputtering gas was conducted, such that the phase shift film 2 made of molybdenum, silicon, nitrogen, and oxygen (MoSiON film) and having a thickness of 74 nm was formed on the transparent substrate 1. Through the above procedure, the single-layer phase shift film 2 having the thickness of 74 nm was formed in contact with a surface of the transparent substrate 1.

Then, the transparent substrate 1 with the phase shift film 2 formed thereon was subjected to a heat treatment in order to reduce film stress of the phase shift film 2 and form an oxidized layer on a surface layer. In particular, a heating furnace (electric furnace) was used to conduct the heat treatment at a heating temperature of 450° C. in the air for an hour and a half. Another transparent substrate 1, which had had the phase shift film 2 formed on its main surface under the same conditions and been subjected to the heat treatment, was prepared. The transmittance and phase difference of the phase shift film 2 with respect to the light at a wavelength of 193 nm were measured using the phase shift amount measurement apparatus (MPM193 manufactured by Lasertec Corporation). As a result, the transmittance was 12.3%, and the phase difference was 176.4 degrees (deg). Further, after analyzing the phase shift film 2 by the scanning transmission electron microscope (STEM) and EDX, formation of the oxidized layer having a thickness of about 1.6 nm measured from the surface of the phase shift film 2 was confirmed. Additionally, the spectroscopic ellipsometer (M-2000D manufactured by J. A. Woollam) was used to measure the optical properties of this phase shift film 2. As a result, at a wavelength of 193 nm, the refractive index n was 2.33, and the extinction coefficient k was 0.42.

As with Example 1, still another transparent substrate 1, which had had the phase shift film 2 formed thereon, was prepared, the film composition in the phase shift film 2 was measured by X-ray photoelectron spectroscopy (XPS), and the measured results were revised (calibrated) to correspond to the Rutherford backscattering spectrometry (RBS) measured results. As a result, the composition in the entire phase shift film 2 including the oxidized layer in its surface layer was 2.7 atom % for Mo, 43.4 atom % for Si, 14.4 atom % for O, and 39.5 atom % for N (however, the measured value for the surface of the phase shift film 2 measured without digging the phase shift film 2 by the sputtering was excluded from the measured results due to the profound effect of contamination). Therefore, Mo/(Mo+Si) is 5.9%, and Si/O is 3.0 in the phase shift film 2. Further, any composition gradient in the film thickness direction was not particularly found in the phase shift film 2 other than the oxidized layer in its surface layer.

Then, the light shielding film 3 and the hard mask film 4 were formed on the phase shift film 2 in this order by a procedure similar to Example 1. By the above method, the mask blank 100 of Example 2 was manufactured, which included the single-layer phase shift film 2, the light shielding film 3 of a three-layer structure, and the hard mask film 4 laminated on the transparent substrate 1.

[Manufacture of Phase Shift Mask]

Then, the mask blank 100 of Example 2 was used to manufacture the phase shift mask 200 of Example 2 by the procedure similar to Example 1.

The half tone phase shift mask 200 of Example 2 manufactured was subjected to the mask pattern inspection by the mask inspection apparatus, and a black defect was confirmed in the phase shift pattern 2a at a location where the programmed defect had been arranged. After the black defect portion was subjected to the EB defect repair using the electron beams and $XeF_2$ gas, the etching end point managed to be detected easily, and the etching on the surface of the transparent substrate 1 managed to be minimized.

Using AIMS193 (manufactured by Carl Zeiss), a simulation of a transfer image upon the exposure transfer to the resist film on the semiconductor device with the exposure light at a wavelength of 193 nm was performed on the half tone phase shift mask 200 of Example 2 after the EB defect repair. As a result of inspection of the image by the exposure transfer in this simulation, it was found that the design specification was satisfied sufficiently. Further, the transfer image of the portion subjected to the EB defect repair was comparable to the transfer images of the other regions. It can be considered from this result that the circuit pattern finally formed on the semiconductor device may have great accuracy, even if the phase shift mask of Example 2 after the EB defect repair is set on the mask stage of the exposure apparatus to perform the exposure transfer to the resist film on the semiconductor device.

Comparative Example 1

[Manufacture of Mask Blank]

The mask blank of Comparative Example 1 was an example in which the film composition in the phase shift film 2 was changed from Example 1, and it was manufactured by the method similar to Example 1 except for the phase shift film 2. Elements constituting the phase shift film 2 of Comparative Example 1 are the same as Example 1, i.e., the phase shift film 2 is made of molybdenum, silicon, nitrogen, and oxygen, and is the single-layer structure film (MoSiON film) similar to Example 1. However, its component ratio (film composition) was changed by modifying the film forming conditions. In particular, the transparent substrate 1 was placed in the single-wafer DC sputtering apparatus, a mixed sintered target of molybdenum (Mo) and silicon (Si) (Mo:Si=4 atom %: 96 atom %) was used, and the reactive sputtering (DC sputtering) using the mixed gas of argon (Ar), nitrogen ($N_2$), oxygen ($O_2$), and helium (He) as a sputtering gas was conducted, such that the phase shift film 2 made of molybdenum, silicon, nitrogen, and oxygen and having a thickness of 66 nm was formed. The material composition in the phase shift film 2 was adjusted by changing the gas flow rate, etc. to be different from Example 1.

The phase shift film 2 was also subjected to the heat treatment under the treatment conditions similar to Example 1. Another transparent substrate 1, which had had the phase shift film 2 of Comparative Example 1 formed on its main surface under the same conditions and been subjected to the heat treatment, was prepared. The transmittance and phase difference of the phase shift film 2 with respect to the light at a wavelength of 193 nm were measured using the phase shift amount measurement apparatus (MPM193 manufactured by Lasertec Corporation). As a result, the transmittance was 12.1%, and the phase difference was 177.1 degrees (deg). Further, after analyzing the phase shift film 2 by STEM and EDX, formation of the oxidized layer having a thickness of about 1.7 nm measured from the surface of the phase shift film 2 was confirmed. Additionally, the spectroscopic ellipsometer was used to measure the optical properties of the phase shift film 2. As a result, the refractive index n was 2.48 and the extinction coefficient k was 0.45 with respect to the light at a wavelength of 193 nm.

Still another transparent substrate 1, which had had the phase shift film 2 formed thereon by the procedure similar to the above, was prepared, the film composition in the phase shift film 2 was measured by XPS, and the measured results were revised (calibrated) to correspond to the RBS measured results. As a result, the composition in the phase shift film 2 other than the oxidized layer in its surface layer was 1.9 atom % for Mo, 47.1 atom % for Si, 16.1 atom % for O, and 34.9 atom % for N. Therefore, Mo/(Mo+Si) is 3.9%, and Si/O is 2.9 in the phase shift film 2. Further, any composition gradient in the film thickness direction was not particularly found in the phase shift film 2 other than the surface layer portion.

Through the above procedure, the mask blank of Comparative Example 1 was manufactured, which included the phase shift film 2 made of MoSiON, the light shielding film 3, and the hard mask film 4 laminated on the transparent substrate 1 (synthetic quartz glass).

[Manufacture of Phase Shift Mask]

Next, the mask blank 100 of Comparative Example 1 was used to manufacture a phase shift mask 200 of Comparative Example 1 by the method similar to Example 1.

The half tone phase shift mask 200 of Comparative Example 1 manufactured was subjected to the mask pattern inspection by the mask inspection apparatus, and a black defect was confirmed in the phase shift pattern 2*a* at a location where the programmed defect had been arranged. While the black defect portion was subjected to the EB defect repair, it was difficult to detect the etching end point, and the etching proceeded from the surface of the transparent substrate 1.

Using AIMS193 (manufactured by Carl Zeiss), a simulation of a transfer image upon the exposure transfer to the resist film on the semiconductor device with the exposure light at a wavelength of 193 nm was performed on the half tone phase shift mask 200 of Comparative Example 1 after the EB defect repair. As a result of inspection of the image by the exposure transfer in this simulation, it was found that the design specification was generally satisfied sufficiently, except for the portion subjected to the EB defect repair. However, the transfer image of the portion subjected to the EB defect repair was at the level that a transfer failure would be caused due to an influence of etching on the transparent substrate 1, etc. It can be expected from this result that when the phase shift mask 200 of Comparative Example 1 after the EB defect repair was set on the mask stage of the exposure apparatus to perform the exposure transfer to the resist film on the semiconductor device, disconnection and short-circuit are found in a circuit pattern finally formed on the semiconductor device.

Comparative Example 2

[Manufacture of Mask Blank]

The mask blank of Comparative Example 2 was an example in which the film composition in the phase shift film 2 was changed from Example 1, and it was manufactured by the method similar to Example 1 except for the phase shift film 2. Elements constituting the phase shift film 2 of Comparative Example 2 are the same as Example 1, i.e., the phase shift film 2 is made of molybdenum, silicon, nitrogen, and oxygen, and is the single-layer structure film (MoSiON film) similar to Example 1. However, its component ratio (film composition) was changed by modifying the film forming conditions. In particular, the transparent substrate 1 was placed in the single-wafer DC sputtering apparatus, a mixed sintered target of molybdenum (Mo) and silicon (Si) (Mo:Si=4 atom %: 96 atom %) was used, and the reactive sputtering (DC sputtering) using the mixed gas of argon (Ar), nitrogen ($N_2$), oxygen ($O_2$), and helium (He) as a sputtering gas was conducted, such that the phase shift film 2 made of molybdenum, silicon, nitrogen, and oxygen and having a thickness of 66 nm was formed. The material composition in the phase shift film 2 was adjusted by changing the gas flow rate, etc. to be different from Example 1.

This phase shift film 2 was also subjected to the heat treatment under the treatment conditions similar to Example 2. Another transparent substrate 1, which had had the phase shift film 2 of Comparative Example 2 formed on its main surface under the same conditions and been subjected to the heat treatment, was prepared. The transmittance and phase difference of the phase shift film 2 with respect to the light at a wavelength of 193 nm were measured using the phase shift amount measurement apparatus (MPM193 manufactured by Lasertec Corporation). As a result, the transmittance was 12.1%, and the phase difference was 177.0 degrees (deg). Further, after analyzing the phase shift film 2 by STEM and EDX, formation of the oxidized layer having a thickness of about 1.8 nm measured from the surface of the phase shift film 2 was confirmed. Additionally, the spectroscopic ellipsometer was used to measure the optical properties of the phase shift film 2. As a result, the refractive index n was 2.48 and the extinction coefficient k was 0.45 with respect to the light at a wavelength of 193 nm.

Still another transparent substrate 1, which had had the phase shift film 2 formed thereon by the procedure similar to the above, was prepared, the film composition in the phase shift film 2 was measured by XPS, and the measured results were revised (calibrated) to correspond to the RBS measured results. As a result, the composition in the entire phase shift film 2 including the oxidized layer in its surface layer was 1.9 atom % for Mo, 46.8 atom % for Si, 16.6 atom % for O, and 34.7 atom % for N (however, the measured value for the surface of the phase shift film 2 measured without digging the phase shift film 2 by the sputtering was excluded from the measured results due to the profound effect of contamination). Therefore, Mo/(Mo+Si) is 3.9%, and Si/O is 2.8 in the phase shift film 2. Further, any composition gradient in the film thickness direction was not particularly found in the phase shift film 2 other than the surface layer portion.

Through the above procedure, the mask blank of Comparative Example 2 was manufactured, which included the phase shift film 2 made of MoSiON, the light shielding film 3, and the hard mask film 4 laminated on the transparent substrate 1 (synthetic quartz glass).

[Manufacture of Phase Shift Mask]

Next, the mask blank 100 of Comparative Example 2 was used to manufacture a phase shift mask 200 of Comparative Example 2 by the method similar to Example 1.

The half tone phase shift mask 200 of Comparative Example 2 manufactured was subjected to the mask pattern inspection by the mask inspection apparatus, and a black defect was confirmed in the phase shift pattern 2*a* at a location where the programmed defect had been arranged. While the black defect portion was subjected to the EB defect repair, it was difficult to detect the etching end point, and the etching proceeded from the surface of the transparent substrate 1.

Using AIMS193 (manufactured by Carl Zeiss), a simulation of a transfer image upon the exposure transfer to the resist film on the semiconductor device with the exposure light at a wavelength of 193 nm was performed on the half tone phase shift mask 200 of Comparative Example 2 after the EB defect repair. As a result of inspection of the image by the exposure transfer in this simulation, it was found that the design specification was generally satisfied sufficiently, except for the portion subjected to the EB defect repair. However, the transfer image of the portion subjected to the EB defect repair was at the level that a transfer failure would be caused due to an influence of the etching on the transparent substrate 1, etc. It can be expected from this result that when the phase shift mask 200 of Comparative Example 2 after the EB defect repair was set on the mask stage of the exposure apparatus to perform the exposure transfer to the resist film on the semiconductor device, disconnection and short-circuit are found in a circuit pattern finally formed on the semiconductor device.

DESCRIPTION OF REFERENCE NUMERALS

1: transparent substrate
2: phase shift film
2*a*: phase shift pattern
3: light shielding film
3*a*, 3*b*: light shielding pattern
4: hard mask film
4*a*: hard mask pattern
5*a*: first resist pattern
6*b*: second resist pattern
100: mask blank
200: phase shift mask

What is claimed is:

1. A mask blank comprising:
    a transparent substrate;
    a phase shift film on the transparent substrate; and
    a light shielding film on the phase shift film,
    wherein the phase shift film is made of a material containing silicon and nitrogen, and
    wherein a refractive index n of the phase shift film with respect to light at a wavelength of 193 nm is at least 1.9 and not more than 3.1, and
    wherein an extinction coefficient k of the phase shift film with respect to light at a wavelength of 193 nm is at least 0.26 and not more than 0.62, and
    wherein the light shielding film is made of a material containing chromium and has a lowermost layer, a lower layer, and an upper layer, and
    wherein, among the lowermost layer, the lower layer, and the upper layer, the lowermost layer is closest to the phase shift film and the upper layer is farthest from the phase shift film, and
    wherein, with respect to light at a wavelength of 193 nm, a refractive index n of the lower layer is less than a refractive index n of the lowermost layer and greater than a refractive index n of the upper layer, and
    wherein, with respect to light at a wavelength of 193 nm, an extinction coefficient k of the lower layer is greater than an extinction coefficient k of the lowermost layer and less than an extinction coefficient k of the upper layer.

2. The mask blank according to claim 1, wherein a film thickness of the lowermost layer is less than a film thickness of the lower layer and greater than a film thickness of the upper layer.

3. The mask blank according to claim 1, wherein a transmittance of the phase shift film with respect to light at a wavelength of 193 nm is at least 10%, and
    wherein the phase shift film is configured to transmit light at a wavelength of 193 nm such that the transmitted light has a phase difference of at least 150 degrees and not more than 190 degrees with respect to light at a wavelength of 193 nm transmitted through air for the same distance as a thickness of the phase shift film.

4. The mask blank according to claim 1, wherein the nitrogen content in the phase shift film is at least 30 atom % and not more than 45 atom %.

5. The mask blank according to claim 1, wherein the phase shift film has a thickness of not more than 90 nm.

6. The mask blank according to claim 1, wherein a surface layer of the phase shift film includes a layer having an oxygen content that is higher than an oxygen content in a portion of the phase shift film that excludes the surface layer.

7. The mask blank according to claim 1, wherein the light shielding film contains one or more elements selected from oxygen, nitrogen, carbon, boron, and fluorine.

8. The mask blank according to claim 1, wherein the light shielding film contains one or more elements selected from molybdenum, indium, and tin.

9. The mask blank according to claim 1, wherein an optical density of the stacked structure of the phase shift film and the light shielding film with respect to the light at a wavelength of 193 nm is at least 3.0.

10. A phase shift mask comprising:
    a transparent substrate;
    a phase shift film with a transfer pattern formed therein on the transparent substrate; and
    a light shielding film with a light shielding band pattern formed therein on the phase shift film,
    wherein the phase shift film is made of a material containing silicon and nitrogen, and
    wherein a refractive index n of the phase shift film with respect to a light at a wavelength of 193 nm is at least 1.9 and not more than 3.1, and
    wherein an extinction coefficient k of the phase shift film with respect to light at a wavelength of 193 nm is at least 0.26 and not more than 0.62, and
    wherein the light shielding film is made of a material containing chromium and has a lowermost layer, a lower layer, and an upper layer, and
    wherein, among the lowermost layer, the lower layer, and the upper layer, the lowermost layer is closest to the phase shift film and the upper layer is farthest from the phase shift film, and
    wherein, with respect to light at a wavelength of 193 nm, a refractive index n of the lower layer is less than a refractive index n of the lowermost layer and greater than a refractive index n of the upper layer, and
    wherein, with respect to light at a wavelength of 193 nm, an extinction coefficient k of the lower layer is greater than an extinction coefficient k of the lowermost layer and less than an extinction coefficient k of the upper layer.

11. The phase shift mask according to claim 10, wherein a film thickness of the lowermost layer is less than a film thickness of the lower layer and greater than a film thickness of the upper layer.

12. The phase shift mask according to claim 10, wherein a transmittance of the phase shift film with respect to light at a wavelength of 193 nm is at least 10%, and wherein the phase shift film is configured to transmit light at a wavelength of 193 nm such that the transmitted light has a phase difference of at least 150 degrees and not more than 190 degrees with respect to light at a wavelength of 193 nm transmitted through air for the same distance as a thickness of the phase shift film.

13. The phase shift mask according to claim 10, wherein the nitrogen content in the phase shift film is at least 30 atom % and not more than 45 atom %.

14. The phase shift mask according to claim 10, wherein the phase shift film has a thickness of not more than 90 nm.

15. The phase shift mask according to claim 10, wherein a surface layer of the phase shift film includes a layer having an oxygen content that is higher than an oxygen content in a portion of the phase shift film that excludes the surface layer.

16. The phase shift mask according to claim 10, wherein the light shielding film contains one or more elements selected from oxygen, nitrogen, carbon, boron, and fluorine.

17. The phase shift mask according to claim 10, wherein the light shielding film contains one or more elements selected from molybdenum, indium, and tin.

18. The phase shift mask according to claim 10, wherein an optical density of the stacked structure of the phase shift film and the light shielding film with respect to the light at a wavelength of 193 nm is at least 3.0.

19. A method for manufacturing a semiconductor device, comprising exposure-transferring a transfer pattern in a resist film on a semiconductor substrate using a phase shift mask comprising:

a transparent substrate;

a phase shift film with a transfer pattern formed therein on the transparent substrate; and a light shielding film with a light shielding band pattern formed therein on the phase shift film, wherein the phase shift film is made of a material containing silicon and nitrogen, and wherein a refractive index n of the phase shift film with respect to a light at a wavelength of 193 nm is at least 1.9 and not more than 3.1, and wherein an extinction coefficient k of the phase shift film with respect to light at a wavelength of 193 nm is at least 0.26 and not more than 0.62, and wherein the light shielding film is made of a material containing chromium and has a lowermost layer, a lower layer, and an upper layer, and wherein, among the lowermost layer, the lower layer, and the upper layer, the lowermost layer is closest to the phase shift film and the upper layer is farthest from the phase shift film, and wherein, with respect to light at a wavelength of 193 nm, a refractive index n of the lower layer is less than a refractive index n of the lowermost layer and greater than a refractive index n of the upper layer, and wherein, with respect to light at a wavelength of 193 nm, an extinction coefficient k of the lower layer is greater than an extinction coefficient k of the lowermost layer and less than an extinction coefficient k of the upper layer.

* * * * *